(12) United States Patent
Um et al.

(10) Patent No.: US 10,998,348 B2
(45) Date of Patent: May 4, 2021

(54) DISPLAY APPARATUS

(71) Applicant: LG Display Co., Ltd., Seoul (KR)

(72) Inventors: Hyun-Chul Um, Paju-si (KR);
Jong-Chan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 133 days.

(21) Appl. No.: 16/460,056

(22) Filed: Jul. 2, 2019

(65) Prior Publication Data
US 2020/0185428 A1    Jun. 11, 2020

(30) Foreign Application Priority Data
Dec. 5, 2018  (KR) .......................... 10-2018-0155429

(51) Int. Cl.
*H01L 27/12* (2006.01)
*G02F 1/1362* (2006.01)
*G02F 1/1333* (2006.01)
*G02F 1/1345* (2006.01)

(52) U.S. Cl.
CPC ...... *H01L 27/1244* (2013.01); *G02F 1/13458* (2013.01); *G02F 1/133345* (2013.01); *G02F 1/136286* (2013.01); *H01L 27/1218* (2013.01); *H01L 27/1248* (2013.01); *H01L 27/1255* (2013.01)

(58) Field of Classification Search
CPC ............. H01L 27/1248; H01L 27/3276; H01L 27/1244; G02F 1/136286; G02F 1/13458; G02F 1/133345
See application file for complete search history.

(56) References Cited

U.S. PATENT DOCUMENTS

| 2013/0194532 | A1* | 8/2013 | Morita ............. G02F 11/13452 |
| | | | 349/123 |
| 2019/0310509 | A1* | 10/2019 | Shin ..................... H01L 27/1255 |
| 2019/0319201 | A1* | 10/2019 | Goh ..................... H01L 51/0097 |

* cited by examiner

*Primary Examiner* — Jose R Diaz
(74) *Attorney, Agent, or Firm* — Morgan, Lewis & Bockius LLP

(57) ABSTRACT

A display apparatus includes a substrate including a display area, in which gate lines and data lines are disposed, and a non-display area, in which a gate driver and a pad part are disposed. A gate insulating layer is on the substrate. Data link lines are on the gate insulating layer to connect data pads of the pad part to the data lines, and an interlayer insulating layer is on the data link lines. Gate voltage supply lines are on the interlayer insulating layer to connect the gate driver with the gate lines. A protective layer is on the interlayer insulating layer to cover the gate voltage supply lines, the protective layer including an opening for exposing the interlayer insulating layer of an area overlapping the data link lines.

19 Claims, 9 Drawing Sheets

DISPLAY APPARATUS

This application claims the benefit of Korean Patent Application No. 10-2018-0155429, filed on Dec. 5, 2018, which is hereby incorporated by reference as if fully set forth herein.

BACKGROUND

Technical Field

The present application relates to a display apparatus, and more particularly, to a display apparatus having a deformed part and capable of preventing short circuits of signal links.

Discussion of the Related Art

In recent years, flexible display apparatuses manufactured to display an image even when bent like paper, by forming a display unit, wirings, etc. on a substrate formed of a material having flexibility, such as plastic, have been attracting attention as next-generation display apparatuses. Such flexible display apparatuses have been widely used not only in computer monitors and televisions, but also in personal portable devices. In addition, research has been conducted into flexible display apparatuses having reduced volume and weight and a wide display area. These display apparatuses may be designed to be used in various manners, according to environments or desired usage. Thus, display panels for displaying an image have been variously changed from a traditional, single, rectangular shape to display panels having deformed parts, such as a partial curved surface or a notch, as well as a circle, an ellipse, etc.

However, in the case of a display apparatus having a curved portion, data link lines for applying data signals to pixels of a display area may be disposed in a non-display area corresponding to the curved portion of the display apparatus. In addition, gate link lines connected to a gate driver GIP may pass over the data link lines in the curved portion of the non-display area.

In addition, in a narrow bezel in the display apparatus, the space of the non-display area may become narrow, and a spacing between the data link lines may also be reduced. In addition, in a process of forming the gate link lines disposed on the data link lines, metal used to form the gate link lines may remain between the data link lines as a residual film, possibly causing a short circuit between the data link lines.

SUMMARY

Accordingly, embodiments of the present disclosure are directed a display apparatus that substantially obviates one or more problems due to limitations and disadvantages of the related art.

An aspect of the present disclosure is to provide a display apparatus capable of preventing short circuits of data link lines.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display apparatus according to an embodiment of the present disclosure includes a substrate including a display area, in which gate lines and data lines are disposed, and a non-display area, in which a gate driver and a pad part are disposed; a gate insulating layer on the substrate; data link lines on the gate insulating layer to connect data pads of the pad part to the data lines; an interlayer insulating layer on the data link lines; gate voltage supply lines on the interlayer insulating layer to connect the gate driver with the gate lines; and a protective layer on the interlayer insulating layer to cover the gate voltage supply lines, the protective layer including an opening for exposing the interlayer insulating layer of an area overlapping the data link lines.

According to another aspect, a display apparatus includes a substrate on which are gate lines, data lines, a gate driver, and a pad part; a gate insulating layer on the substrate; data link lines on the gate insulating layer and connecting the pad part with the data lines; an interlayer insulating layer on the data link lines; gate voltage supply lines on the interlayer insulating layer and connecting the gate driver with the gate lines; and a protective layer on the interlayer insulating layer and covering the gate voltage supply lines, wherein the protective layer including an opening that exposes the interlayer insulating layer at an area overlapping the data link lines.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
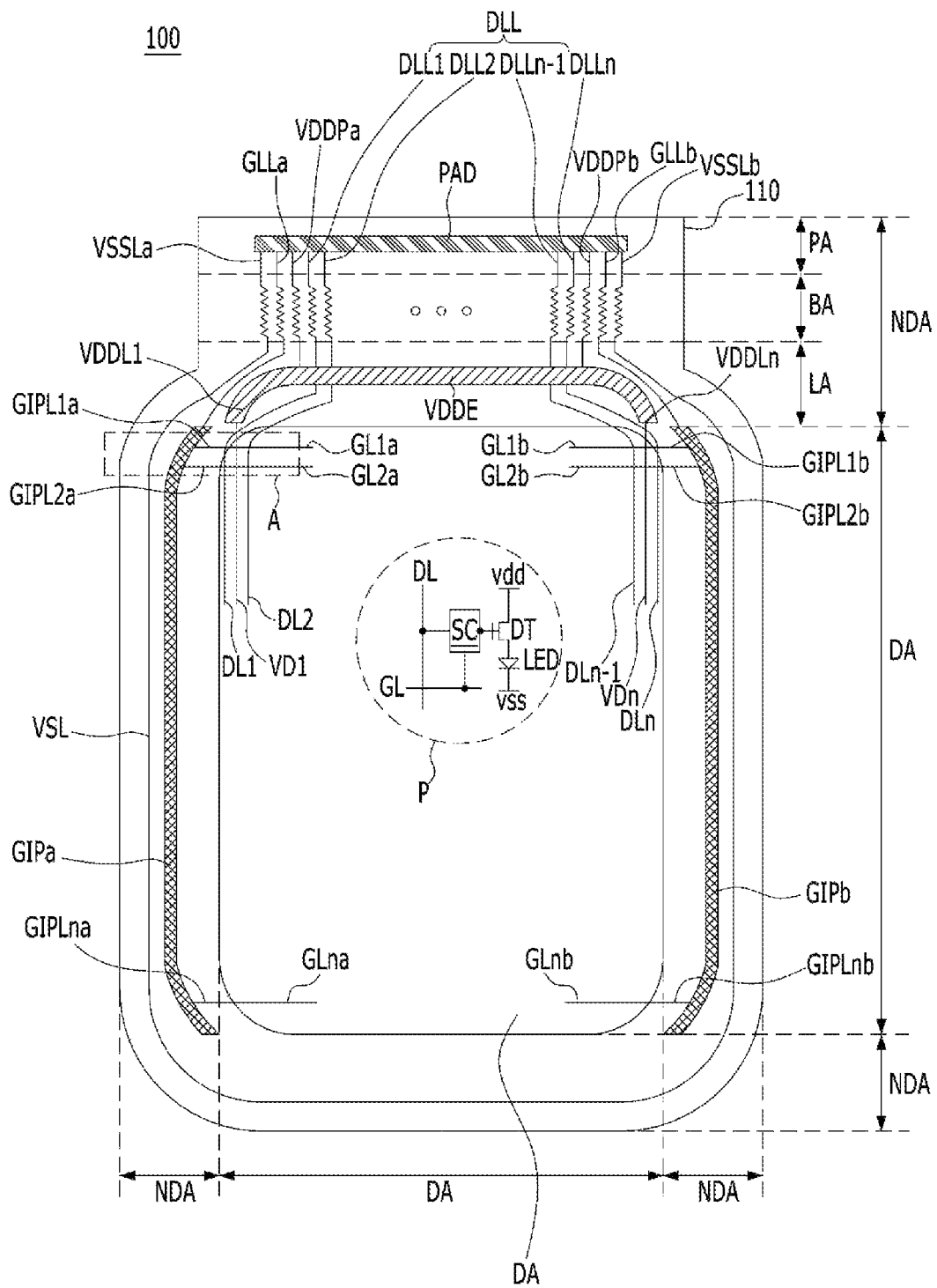
FIG. 1 is a plan view showing a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

The shapes, sizes, ratios, angles, numbers, and the like, which are illustrated in the drawings in order to describe various embodiments of the present disclosure, are merely given by way of example, and therefore, the present disclosure is not limited to the illustrations in the drawings. The same or extremely similar elements are designated by the same reference numerals throughout the specification. In addition, in the description of the present disclosure, a detailed description of related known technologies will be omitted when it may make the subject matter of the present disclosure rather unclear. In the present specification, when the terms "comprises," "includes," and the like are used, other elements may be added unless the term "only" is used. An element described in the singular form is intended to include a plurality of elements unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on," "above," "below," "aside," or the like, one or more other parts may be located between the two parts unless the term "directly" or "closely" is used.

It will be understood that, when an element or a layer is referred to as being "on" another element or layer, it can be directly on the other element or intervening elements may also be present.

It will be understood that, although e terms first, second, etc. may be used herein to describe various elements, these elements should not be limited by these terms. These terms are only used to distinguish one element from another. Therefore, a first element could be termed a second element within the technical scope of the present disclosure.

Like reference numerals refer to like elements throughout the specification.

The size and thickness of each component shown in the figures are shown for convenience of description, without being limited thereto.

The respective features of the various embodiments of the present disclosure may be partially or wholly coupled to and combined with each other, and various technical linkage and driving thereof are possible. These various embodiments may be performed independently of each other, or may be performed in association with each other.

Hereinafter, various embodiments of the present disclosure will be described in detail with reference to the accompanying drawings.

FIG. 1 is a plan view showing a display apparatus according to an embodiment of the present disclosure.

With reference to FIG. 1, the display apparatus 100 may include a display area DA, in which information is displayed, and a non-display area NDA, in which information is not displayed.

The display area DA may refer to an area in which an input image is displayed and a plurality of pixels P is arranged in a matrix. In addition, the non-display area NDA may include a pad area PA, in which a pad is disposed, a bending area BA, in which a substrate 110 is bent, and a link area LA.

The link area LA may be disposed between the display area DA and the bezel area BA. The link area LA may refer to an area in which link lines are disposed for transmitting signals to wirings disposed in the display area DA. Various link lines may be disposed in the link area. For example, gate link lines GLLa and GLLb (hereinafter referred to as GLL), data link lines DLL1 to DLLn (hereinafter referred to as DLL), first link power supply lines VDDL1 to VDDLn (hereinafter referred to as VDDL) and second link power supply lines VSSLa and VSSLb (hereinafter referred to as VSSL) may be disposed in the link area LA.

The bending area BA may be an area in which the substrate 110 is bent. The bending area BA may be disposed between the link area LA and the pad area PA. The substrate 110 may be maintained in a flat state without being bent in an area other than the bending area BA, and the substrate 110 of the bending area BA may be configured to be bent. Therefore, the display apparatus 100 may be bent such that two non-bending areas of the substrate 110 except for the bending area BA face each other.

The pad area PA may refer to an area in which an image is not displayed and a plurality of pads is formed. The pad area PA may extend from one side of the bending area BA. The pad area PA may be an area in which a pad PAD is disposed. For example, a first power supply pad, a data pad, a gate pad, and a second power supply pad may be disposed in the pad area PA.

Gate drivers GIPa and GIPb (hereinafter referred to as GIP) of a gate driving circuit, the gate link line GLL, the data link lines DLL, the first link power supply lines VDDL, the second link power supply lines VSSL, a second power supply line VSL, a first power supply electrode VDDE, and first power supply connection lines VDDPa and VDDPb (hereinafter referred to as VDDP) connecting the first power supply electrode VDDE with a first power supply pad may be disposed in the non-display area NDA.

In the display area DA, data lines DL1 to DLn (hereinafter referred to as DL) and gate lines GL1 to GLn (hereinafter referred to as GL) may be disposed to intersect with each other. In addition, pixels P may be arranged at intersections in a matrix.

Each pixel P may include a driving thin film transistor (hereinafter referred to as a driving TFT) for controlling the amount of current flowing in a light emitting element (LED) and a programming unit SC for setting a voltage between the gate and the source of the driving TFT (DT). The pixels P of the display apparatus 100 may receive a first power voltage Vdd, which is a high-potential voltage, through first power supply lines VD1 to VDn (hereinafter referred to as VD) and receive a second power voltage Vss, which is a low-potential voltage, through a second power supply line VSL.

The first power supply line VD may receive the first power voltage Vdd through the first power supply electrode VDDE disposed in the non-display area NDA. The first power voltage Vdd supplied through the first power supply electrode VDDE may be supplied to the first power supply lines VD disposed in the display area DA through the first link power supply lines VDDL. For example, the first power voltage Vdd may be supplied to the first power supply pad located on the pad PAD of the pad area PA. In addition, the first power voltage Vdd supplied to the first power supply pad may be supplied to the first power supply electrode VDDE of the link area LA through the first power connection lines VDDP. The first power voltage Vdd supplied to the first power supply electrode VDDE may be supplied to the first power supply lines VD of the display area DA through the first link power supply lines VDDL.

In addition, the second power voltage Vss may be supplied to the second link power supply lines VSSL of the non-display area DNA through a second power supply pad located on the pad PAD of the pad area PA. Furthermore, the second power voltage Vss supplied to the second link power supply lines VSSL may be supplied to the pixels P of the display area DA through the second power supply line VSL. For example, the second power voltage Vss may be supplied to a 2a-th link power supply line VSSLa and a 2b-th link power supply line VSSLb of the second link power supply line VSSL connected to the second power supply pad located on the pad PAD. The second power voltage Vss supplied to the 2a-th link power supply line VSSLa and the 2b-th link power supply line VSSLb of the second link power supply lines VSSL may be supplied to the pixels P of the display area DA through the second power supply line VSL. The 2a-th link power supply line VSSLa of the second link power supply lines VSSL may be connected to one side of the second power supply line VSL to supply the second power voltage Vss. In addition, the 2b-th link power supply line VSSLb of the second link power supply lines VSSL may be connected to the other side of the second power supply line VSL to supply the second power voltage Vss.

The programming unit SC may include at least one switch TFT and at least one storage capacitor. The switch TFT may be turned on in response to scan signals from gate lines GL to apply data voltages from data lines DL to one electrode of the storage capacitor. The driving TFT DT may control the amount of current supplied to a light emitting element (LED) according to the level of the voltage of the storage capacitor, thereby controlling the amount of light emitted from the light emitting element (LED). The amount of light of the light emitting element (LED) may be proportional to the amount of current supplied from the driving TFT DT. In addition, a semiconductor layer of the TFTs configuring the pixel P may include at least one of amorphous silicon, polysilicon, or an oxide semiconductor material. The light emitting element (LED) may include an anode, a cathode, and a light emitting structure interposed between the anode and the cathode. The anode may be connected to the driving TFT DT. The light emitting structure may include an emission layer EML, a hole injection layer HIL and a hole transport layer HTL on one side thereof, and an electron transport layer ETL and an electron injection layer EIL on the other side thereof, with the emission layer interposed therebetween.

The data voltage may be supplied to the data link line DLL of the non-display area NDA through the data pad located on the pad PAD of the pad area PA. In addition, the data voltage supplied to the data link lines DLL may be supplied to the data lines DL of the display area AA.

The gate driving voltage may be supplied to the gate link lines GLL of the non-display area NDA through the gate pad located on the pad PAD of the pad area PA. In addition, the gate driving voltage supplied to the gate link lines GLL may be supplied to the gate drivers GIP. The gate driving voltage may be supplied to the gate lines GL of the display area DA through gate voltage supply line GIPL1 to GIPLn (hereinafter referred to as GIPL) connected to the gate drivers GIP. The gate driving voltage may include a gate high voltage VGH and a gate low voltage VGL. In addition, the gate drivers GIP may receive signals, such as a start pulse, gate shift clocks, and a flicker signal, in addition to the gate driving voltage. The start pulse, the gate shift clocks, and the flicker signal may swing between 0V and 3.3V. The gate shift clocks may be n-phase clock signals having a predetermined phase difference. The gate high voltage VGH may be a voltage equal to or greater than a threshold voltage of the thin film transistor (TFT) formed in a thin film transistor array of the display apparatus 100 and may be about 28V, and the gate low voltage VGL may be a voltage equal to or less than a threshold voltage of the TFT formed in the thin film transistor array of the display apparatus 100 and may be about −5V, without being limited thereto.

The gate drivers GIP may include a first gate driver GIPa located on the left side of the display area DA and a second gate driver GIPb located on the right side of the display area DA. The first gate driver GIPa may receive a gate driving voltage through the first gate link line GLLa of the gate link lines GLL. The second gate driver GIPb may receive a gate driving voltage through the second gate link line GLLb of the gate link lines GLL. In addition, the gate driving voltage supplied to the first gate driver GIPa may be supplied to the first gate lines GL1a to GLna (hereinafter referred to as GLa) of the gate line GL through the first gate voltage supply lines GIPL1a to GIPLna (hereinafter referred to as GIPLa) of the gate voltage supply line GIPL. The gate driving voltage supplied to the second gate driver GIPb may be supplied to the second gate lines GL1b to GLnb (hereinafter referred to as GLb) of the gate lines GL through the second gate voltage supply lines GIPL1b to GIPLnb (hereinafter referred to as GIPLb) of the gate voltage supply lines GIPL.

Although in FIG. 1, the gate drivers GIP are shown as being disposed on both sides of the display area DA to supply gate pulses from both ends of the display area DA to the gate lines GL, embodiments are not limited thereto, and the gate driver may be disposed on one side of the display area DA to supply the gate pulses from one side of the display area DA to the gate lines GL. When the gate drivers GIP are disposed on both sides of the display area DA, gate pulses having the same phase and the same amplitude may be supplied to the pixels P arranged on the same horizontal line through the gate lines GL.

Figure 2:
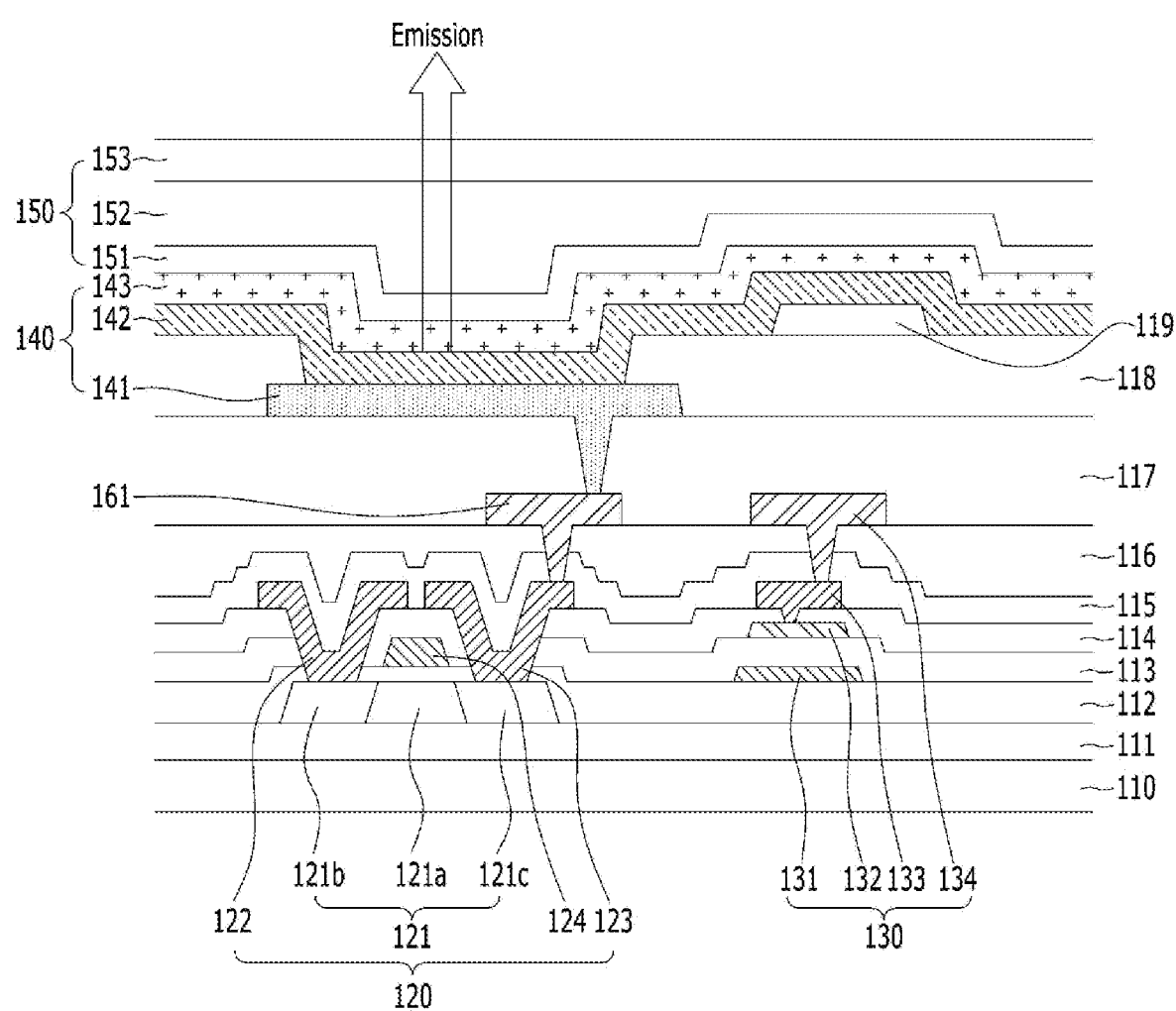
FIG. 2 is a cross-sectional view showing the structure in a pixel P shown in FIG. 1.

FIG. 2 is a cross-sectional view showing the structure in the pixel P shown in FIG. 1. FIG. 2 shows the components of the display area DA of the display apparatus 100.

With reference to FIG. 2, the display apparatus 100 according to an embodiment of the present disclosure may include a thin film transistor 120, a storage capacitor 130, a light emitting element 140, a sealing part 150, a substrate 110, a buffer layer 111, a gate insulating layer 112, a first interlayer insulating layer 113, a second interlayer insulating layer 114, a protective layer 115, a first planarization layer 116, a second planarization layer 117, an auxiliary electrode 161, a bank 118, and a spacer 119. The flexible substrate 110 may support various components of the display apparatus 100. The flexible substrate 110 may be formed of a plastic material having flexibility. If the flexible substrate 110 is formed of a plastic material, the flexible substrate may be formed of polyimide (PI), for example.

If the substrate 110 is formed of polyimide (PI), a process of manufacturing a display apparatus may be performed in a state in which a support substrate formed of glass is disposed below the flexible substrate 110, and then the support substrate may be released after the manufacturing process is finished. In addition, after the support substrate is released, a back plate supporting the flexible substrate 110 may be disposed below the flexible substrate 110.

However, if the flexible substrate 110 is formed of a polyimide (PI) layer, water may permeate into the thin film transistor 120 or the light emitting device 140 through the flexible substrate 110 formed of the polyimide (PI) layer, which may thereby deteriorate performance of the display apparatus 100. Thus, the display device 100 according to one embodiment of the present disclosure may have a flexible substrate 110 that includes two base layers in order to prevent performance of the display apparatus 100 from deteriorating by water permeation. Furthermore, by forming a silicon oxide (SiOx) layer having excellent water permeation prevention effects between the two base layers, water may be prevented from permeating into the lower base layer, thereby improving reliability.

In addition, a back bias may be formed by charges stored in the base layers configuring the flexible substrate 110, thereby having influence on the thin film transistor 120. Accordingly, a separate metal layer may be disposed between the flexible substrate 110 and the thin film transistor 120, in order to block charges stored in the base layers.

If the bending area BA in which the flexible substrate 110 is bent is present, an adhesive force between the base layers and the silicon oxide (SiOx) layer interposed between the two base layers may be lowered by water in the bending area BA of the flexible substrate 110. In addition, when the adhesive force between the base layers and the silicon oxide (SiOx) layer is lowered, stress may be applied to the bending area BA of the flexible substrate 110, thereby separating the base layer. Reliability of the product may be lowered due to separation of the base layer from the flexible substrate 110.

Accordingly, in the display apparatus according to an embodiment of the present disclosure, an inorganic insulating layer disposed between the two base layers may be a double layer including a silicon oxide (SiOx) layer and a silicon nitride (SiNx) layer, in order to have a structure which is robust against bending while improving environmental reliability. However, the disclosure is not limited thereto, and a triple layer including a silicon oxide (SiOx) layer and a silicon nitride (SiNx) layer may be formed.

With reference to FIG. 2, the buffer layer 110 having a monolayer or multilayer structure may be disposed on the substrate 110. The buffer layer 111 disposed on the flexible substrate 110 may be composed of a single layer or multiple layers of silicon nitride (SiNx) or silicon oxide (SiOx).

The buffer layer 111 may improve adhesive force between the layers formed on the buffer layer 111 and the substrate 110, and may block an alkali component from flowing out from the substrate 110. However, the buffer layer 111 may be omitted based on the type and material of the substrate 110 and the structure and type of the thin film transistor.

According to an embodiment of the present disclosure, the buffer layer 111 may be formed of multiple layers in which silicon dioxide ($SiO_2$) and silicon nitride (SiNx) are alternately formed.

In the display area DA of the flexible substrate 110, the thin film transistor 120 may be disposed on the buffer layer 111. The thin film transistor 120 may include an active layer 121, a gate electrode 124, a source electrode 122, and a drain electrode 123. According to the design of the pixel circuit, the source electrode 122 may become a drain electrode and the drain electrode 123 may become a source electrode. In the display area DA of the flexible substrate 110, the active layer 121 of the thin film transistor 120 may be disposed on the buffer layer 111.

The active layer 121 may include low-temperature polysilicon (LTPS). The polysilicon material has high mobility (100 $cm^2/Vs$ or more), low energy consumption, and excellent reliability, and thus is applicable to a driving device gate driver for driving thin film transistors for a display device and/or a multiplexer MUX, and to the active layer of the driving thin film transistor in the display apparatus according to the embodiment of the present disclosure, without being limited thereto. For example, the polysilicon material is applicable to the active layer of a switching thin film transistor according to the characteristics of the display apparatus. An amorphous silicon (a-Si) material may be deposited on the buffer layer 111, and polysilicon may be formed through a dehydrogenation process and a crystallization process and then patterned, thereby forming the active layer 121. The active layer 121 may include a channel area 121a in which a channel is formed when the thin film transistor 120 is driven, and a source area 121b and a drain area 121c located at both sides of the channel area 121a. The source area 121b may refer to a portion of the active layer 121 connected to the source electrode 122, and the drain area 121c may refer to a portion of the active layer 121 connected to the drain electrode 123. The source area 121b and the drain area 121c may be configured by ion doping (impurity doping) of the active layer 121. The source area 121b and the drain area 121c may be generated by doping the polysilicon material with ions, and the channel area 121a may refer to a portion in which the polysilicon material remains without ion doping.

The active layer 121 may be formed of an oxide semiconductor. Because the oxide semiconductor material has a greater band gap than a silicon material, electrons do not cross the band gap in an off state and thus off-current is low. Accordingly, the thin film transistor including the active layer formed of oxide semiconductor is suitable for a switching thin film transistor having a short on time and a long off time, without being limited thereto. According to the characteristics of the display apparatus, the thin film transistor including the active layer formed of an oxide semiconductor is applicable to a driving thin film transistor. In addition, because off-current is low and thus auxiliary capacity may be reduced, the thin film transistor including the active layer formed of an oxide semiconductor is suitable for a high-resolution display device. For example, the active layer 121 may be formed of various metal oxides such as indium-gallium-zinc-oxide (IGZO). Although it is assumed that the active layer 121 of the thin film transistor 120 is formed of IGZO among various metal oxides, the present disclosure is not limited thereto, and other metal oxides such as indium-zinc-oxide (IZO), indium-gallium-tin-oxide (IGTO), or indium-gallium-oxide (IGO) may be used instead of IGZO. The active layer may be formed by depositing metal oxide on the buffer layer 111, performing a heat treatment process for stabilization, and patterning the metal oxide.

In the display area DA of the flexible substrate 110, the gate insulating layer 112 may be disposed on the active layer 121 of the thin film transistor 120. The gate insulating layer 112 may be composed of a single layer or multiple layers of silicon nitride (SiNx) or silicon oxide (SiOx). In the gate insulating layer 112, contact holes for connecting the source electrode 122 and the drain electrode 123 of the thin film transistor 120 with the source area 121b and the drain area 121c of the active layer 121 of the thin film transistor 120 may be formed. In addition, the gate insulating layer 112 may not be disposed in the bending area BA of the flexible substrate 110. In addition, the gate insulating layer 112 may not be disposed in the non-display area NDA of the flexible substrate 110.

In the display area DA of the flexible substrate 110, the gate electrode 124 of the thin film transistor 120, the gate line GL connected to the gate electrode 124, and the first capacitor electrode 131 of the storage capacitor 130 may be disposed on the gate insulating layer 112. The gate electrode 124, the gate line GL, and the first capacitor electrode 131 may be formed of a single layer or multiple layers formed of any one of molybdenum (Mo), copper (Cu), titanium (Ti), aluminum (Al), chrome (Cr), gold (Au), nickel (Ni), and neodymium (Nd) or an alloy thereof, without being limited thereto. The gate electrode 124 may be formed on the gate insulating layer 112 to overlap the channel area 121a of the active layer 121 of the thin film transistor 120.

In the display area DA of the flexible substrate 110, the first interlayer insulating layer 113 may be disposed on the gate insulating layer 112 to cover the gate electrode 124, the gate line GL, and the first capacitor electrode 131. The first interlayer insulating layer 113 may be formed of a single layer or multiple layers of silicon nitride (SiNx) or silicon oxide (SiOx). In the first interlayer insulating layer 113, contact holes for exposing the source area 121b and the drain area 121c of the active layer 121 of the thin film transistor 120 may be formed. In addition, the first interlayer insulating layer 113 may not be disposed in the bending area BA of the flexible substrate 110.

The second capacitor electrode 132 of the storage capacitor 130 may be disposed on the first interlayer insulating layer 113 to overlap the first capacitor electrode 131. The second capacitor electrode 132 may be formed of a single layer or multiple layers formed of any one of molybdenum (Mo), copper (Cu), titanium (Ti), aluminum (Al), chrome (Cr), gold (Au), nickel (Ni) and neodymium (Nd) or an alloy thereof, without being limited thereto.

The second interlayer insulating layer 114 may be disposed to cover the second capacitor electrode 132 of the storage capacitor 130. Contact holes for exposing the second capacitor electrode 132 may be formed in the second interlayer insulating layer 114. Contact holes for exposing the source area 121b and the drain area 121c of the active layer 121 may be formed in the second interlayer insulating layer 114. The second interlayer insulating layer 114 may be formed of a single layer formed of an inorganic material or multiple layers formed of different inorganic materials. In addition, the second interlayer insulating layer 114 may be formed of a single layer or multiple layers of silicon nitride (SiNx) or silicon oxide (SiOx), without being limited thereto.

In the display area DA of the flexible substrate 110, the source electrode 122 and the drain electrode 123 of the thin film transistor 120 may be disposed on the second interlayer insulating layer 114. In addition, the third capacitor electrode 133 may be disposed on the second interlayer insulating layer 114 to overlap the second capacitor electrode 132 of the storage capacitor 130. The source electrode 122 and the drain electrode 123 of the thin film transistor 120 may be connected to the active layer 121 of the thin film transistor 120 through the contact holes formed in the gate insulating layer 112, the first interlayer insulating layer 113, and the second interlayer insulating layer 114. Accordingly, the source electrode 122 of the thin film transistor 120 may be connected to the source area 121b of the active layer 121 through the contact holes formed in the gate insulating layer 112, the first interlayer insulating layer 113 and the second interlayer insulating layer 114. The drain electrode 123 of the thin film transistor 120 may be connected to the drain area 121c of the active layer 121 through the contact holes formed in the gate insulating layer 112, the first interlayer insulating layer 113, and the second interlayer insulating layer 114. In addition, the third capacitor electrode 133 of the storage capacitor 130 may be connected to the second capacitor electrode 132 through the contact holes of the second interlayer insulating layer 114. The source electrode 122, the drain electrode 123, and the third capacitor electrode 133 may be formed of a single layer or multiple layers formed of any one of molybdenum (Mo), copper (Cu), titanium (Ti), aluminum (Al), chrome (Cr), gold (Au), nickel (Ni), and neodymium (Nd), or an alloy thereof, without being limited thereto. For example, the source electrode 122, the drain electrode 123, and the third capacitor electrode 133 may be formed of a three-layer structure of conductive metal material, such as titanium (Ti)/aluminum (Al)/titanium (Ti), without being limited thereto.

In the display area DA of the flexible substrate 110, the protective layer 115 may be disposed on the source electrode 122, the drain electrode 123, and the third capacitor electrode 133. The protective layer 115 may be formed of a single layer or multiple layers of silicon nitride (SiNx) or silicon oxide (SiOx). Contact holes for exposing the drain electrode 123 of the thin film transistor 120 may be formed in the protective layer 115. Contact holes for exposing the third capacitor electrode 133 of the storage capacitor 130 may be formed in the protective layer 115. The protective layer 115 may not be disposed in the bending area BA of the flexible substrate 110.

In the display area DA of the flexible substrate 110, the first planarization layer 116 may be disposed on the protective layer 115. As shown in FIG. 2, contact holes for exposing the drain electrode 123 may be formed in the first planarization layer 116. In addition, contact holes for exposing the third capacitor electrode 133 may be formed in the first planarization layer 116. The first planarization layer may be an organic material layer for planarizing and protecting the upper portion of the thin film transistor 120. For example, the first planarization layer 115 may be formed of an organic material such as acryl resin, epoxy resin, phenolic resin, polyamide resin, polyimide resin, etc., without being limited thereto.

In the display area DA of the flexible substrate 110, the auxiliary electrode 161 and the fourth capacitor electrode 134 of the storage capacitor 130 may be disposed on the first planarization layer 116. The auxiliary electrode 161 may be connected to the drain electrode 123 of the thin film transistor 120 through the contact holes of the first planarization layer 116 and the protective layer 115. The auxiliary electrode 161 may serve to electrically connect the thin film transistor 120 with the light emitting device 140. The fourth capacitor electrode 134 of the storage capacitor 130 may be connected to the third capacitor 133 of the storage capacitor 130 exposed through the contact holes of the first planarization layer 116 and the protective layer 115. The auxiliary electrode 161 may be formed of a single layer or multiple layers formed of any one of molybdenum (Mo), copper (Cu), titanium (Ti), aluminum (Al), chrome (Cr), gold (Au), nickel (Ni), neodymium (Nd), or an alloy thereof, without being limited thereto. The auxiliary electrode 161 may be formed of the same material as the source electrode 122 and the drain electrode 123 of the thin film transistor 120.

In the display area DA of the flexible substrate 110, the second planarization layer 117 may be disposed on the auxiliary electrode 161, the fourth capacitor electrode 134, and the first planarization layer 116. As shown in FIG. 2, contact holes for exposing the auxiliary electrode 161 may be formed in the second planarization layer 117. The second planarization layer 117 may further reduce the step difference of the substructure due to the fourth capacitor electrode 134 of the storage capacitor 130 and the auxiliary electrode 161 on the first planarization layer 116, and may further protect the substructure. The second planarization layer 117 may be formed of an organic material such as acryl resin, epoxy resin, phenolic resin, polyamide resin, polyimide resin, etc., without being limited thereto.

In the display area DA of the flexible substrate 110, the light emitting element 140 may be disposed on the second planarization layer 117. The light emitting element 140 may include a first electrode 141, a light emitting structure 142, and a second electrode 143. The light emitting element 140 may not be disposed in the bending area BA of the flexible substrate 110.

The first electrode 141 of the light emitting element 140 may be disposed on the second planarization layer 117. The first electrode 141 may be electrically connected to the auxiliary electrode 161 through the contact holes formed in the second planarization layer 117. Accordingly, the first electrode 141 may be connected to the auxiliary electrode 161 through the contact holes formed in the second planarization layer 117, thereby being electrically connected to the thin film transistor 120.

The first electrode 141 may be formed of multiple layers including a transparent conductive film and an opaque conductive film having high reflection efficiency. The transparent conductive film may be formed of a material having a relatively high work function, such as indium-tin-oxide (ITO) or indium-zinc-oxide (IZO). The opaque conductive film may be formed of a monolayer or multilayer structure including Al, Ag, Cu, Pb, Mo, and Ti, or an alloy thereof. For example, the first electrode 141 may be formed to have a structure in which a transparent conductive film, an opaque conductive film, and a transparent conductive film are sequentially stacked. However, the present disclosure is not limited thereto, and the first electrode may be formed to have a structure in which a transparent conductive film and an opaque conductive film are sequentially stacked.

Because the display apparatus 100 according to an embodiment of the present disclosure is a top emission display apparatus (denoted by an arrow in the FIG. 2), the first electrode 141 may be an anode. If the display apparatus 100 is a bottom emission display apparatus, the first electrode 141 disposed on the second planarization layer 117 may be a cathode.

The bank 118 may be disposed on the first electrode 141 and the second planarization layer 117. An opening for exposing the first electrode 141 may be formed in the bank 118. The bank 118 may define the light emission area of the display apparatus 100 and thus may be referred to as a pixel definition film. The spacer 119 may be further disposed on the bank 118. The light emitting structure 142 including a light emitting layer may be further disposed on the first electrode 141.

The light emitting structure 142 may be formed by stacking a hole layer, a light emitting layer, an electron layer, etc. on the first electrode 141 in this order or an inverse order thereof. In addition, the light emitting structure 142 may include first and second light emitting structures facing each other with a charge generation layer interposed therebetween. In this case, any one of the first and second light emitting structures may generate blue light, and the other of the first and second light emitting structures may generate yellow-green light, thereby generating white light through the first and second light emitting structures. The white light generated by the light emitting structure 142 may be input to a color filter located above the light emitting structure 142, thereby implementing a color image. Color light corresponding to each subpixel in each light emitting structure 142 may be generated without a separate color filter, thereby implementing the color image. For example, the light emitting structure 142 of a red (R) subpixel may generate red light, the light emitting structure 142 of a green (G) subpixel may generate green light, and the light emitting structure 142 of a blue (B) subpixel may generate blue light.

The second electrode 143 may be further disposed on the light emitting structure 142. The second electrode 143 may be disposed on the light emitting structure 142 to face the first electrode 141 with the light emitting structure 142 interposed therebetween. In the display apparatus 100 according to an embodiment of the present disclosure, the second electrode 143 may be a cathode.

In the display area DA of the flexible substrate 110, the sealing part 150 may be disposed on the light emitting device element. For example, the sealing part 150 for suppressing water permeation may be further disposed on the second electrode 143. The sealing part 150 may not be disposed in the bending area BA of the flexible substrate 110.

The sealing part 150 may include a first inorganic sealing layer 151, a second organic sealing layer 152, and a third inorganic sealing layer 153. The first inorganic sealing layer 151 of the sealing part 150 may be disposed on the second electrode 142. The second sealing layer 152 may be disposed on the first inorganic sealing layer 151. In addition, the third inorganic sealing layer 153 may be disposed on the second inorganic sealing layer 152. The first inorganic sealing layer 151 and the third inorganic sealing layer 153 of the sealing part 150 may be formed of an inorganic material such as silicon nitride (SiNx) or silicon oxide (SiOx). The second inorganic sealing layer 152 of the sealing part 150 may be formed of an organic material such as acryl resin, epoxy resin, phenolic resin, polyamide resin, polyimide resin, etc.

Figure 3:
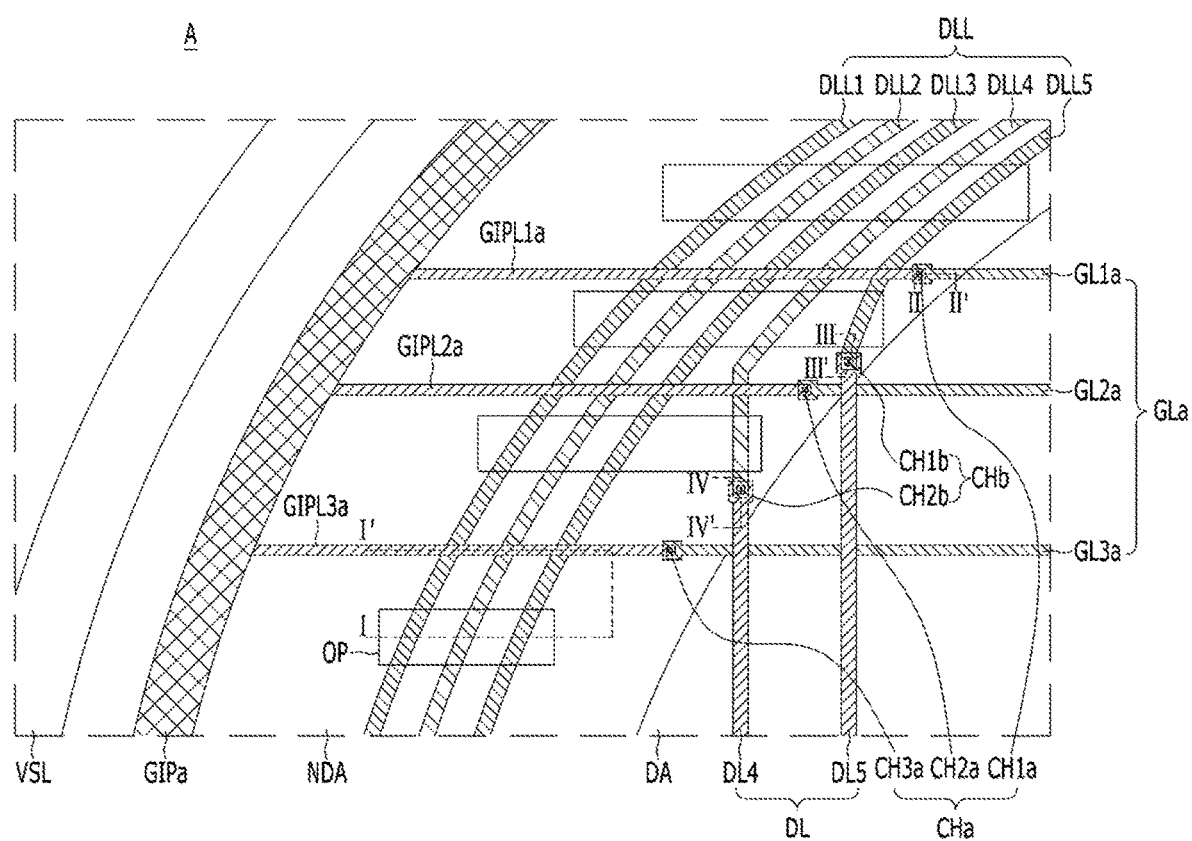
FIG. 3 is an enlarged plan view of an area A shown in FIG. 1.
Figure 4:
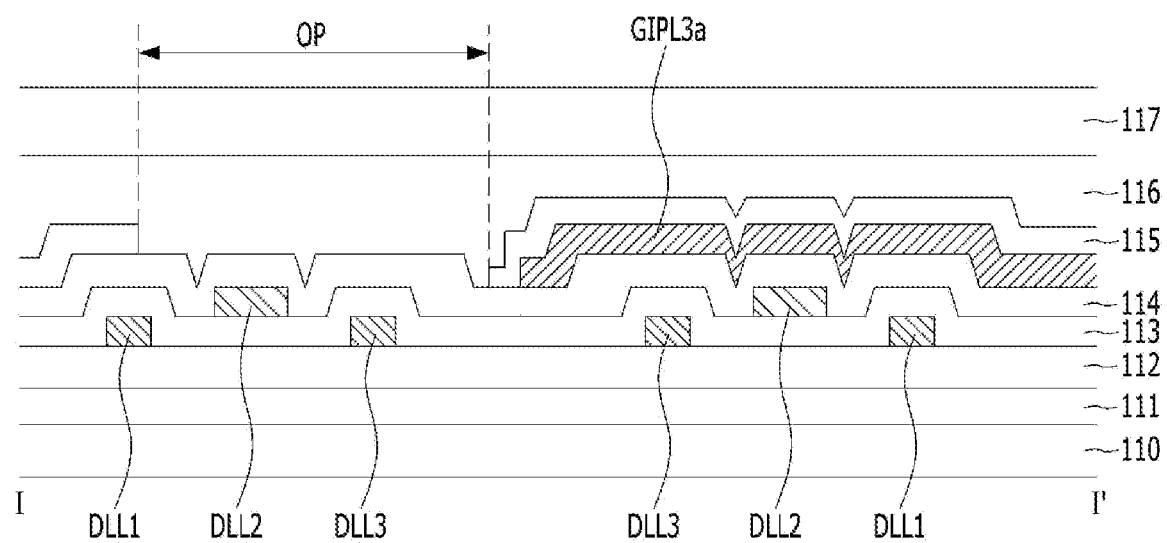
FIG. 4 is a cross-sectional view taken along line I-I' of FIG. 3.
Figure 5A:
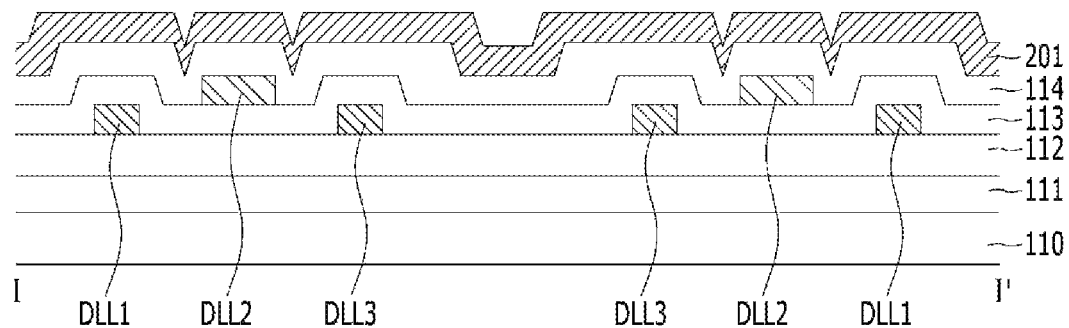
FIGS. 5A to 5F are cross-sectional views taken along line I-I' of FIG. 3, which show a manufacturing process.
Figure 5B:
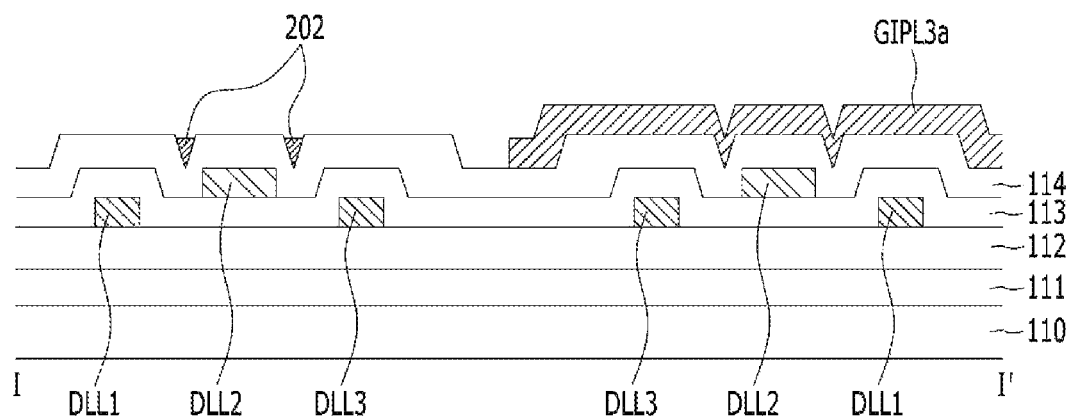
Figure 5C:
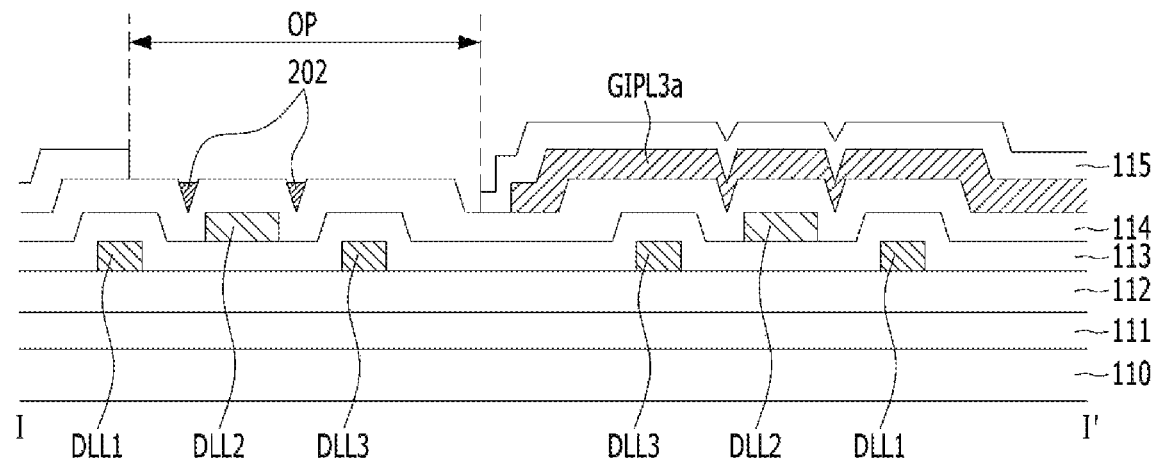
Figure 5D:
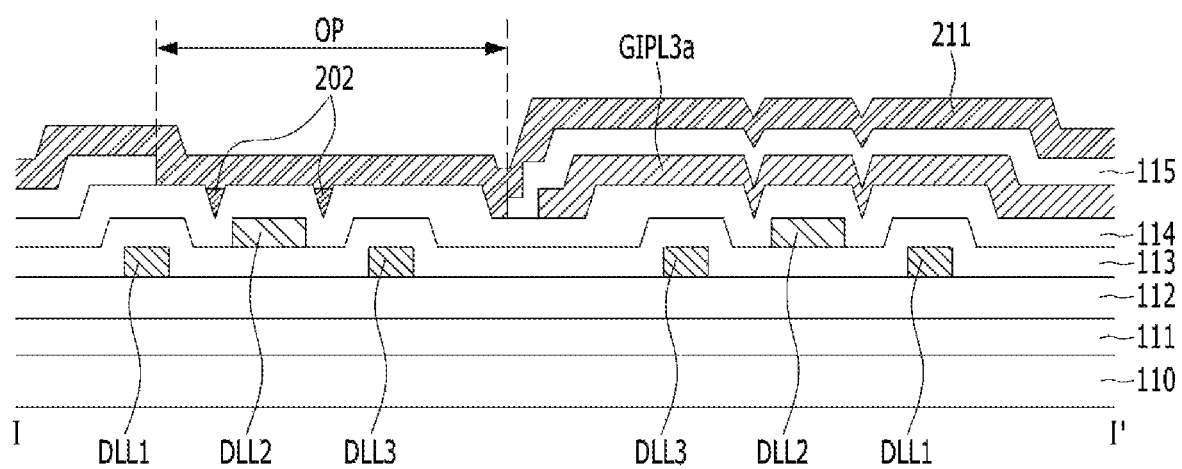
Figure 5E:
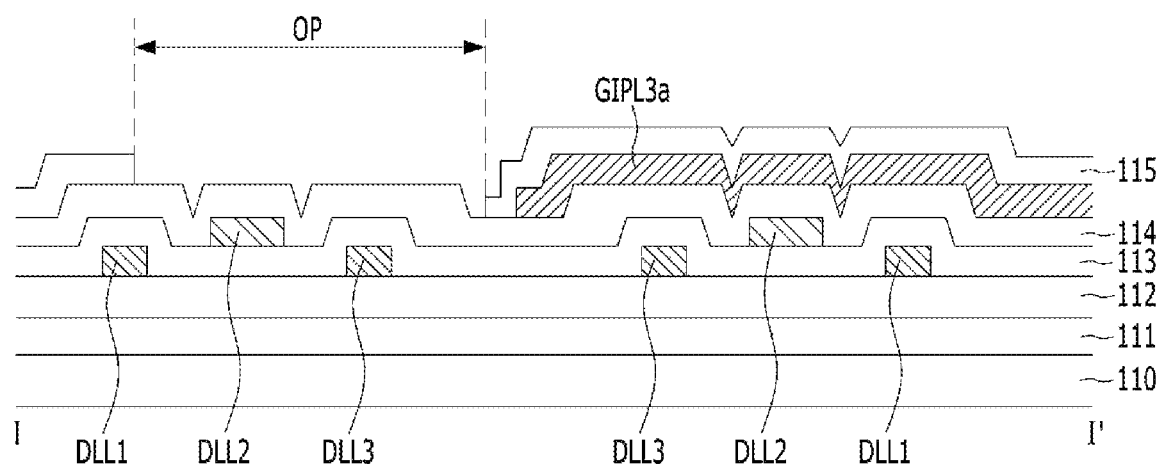
Figure 5F:
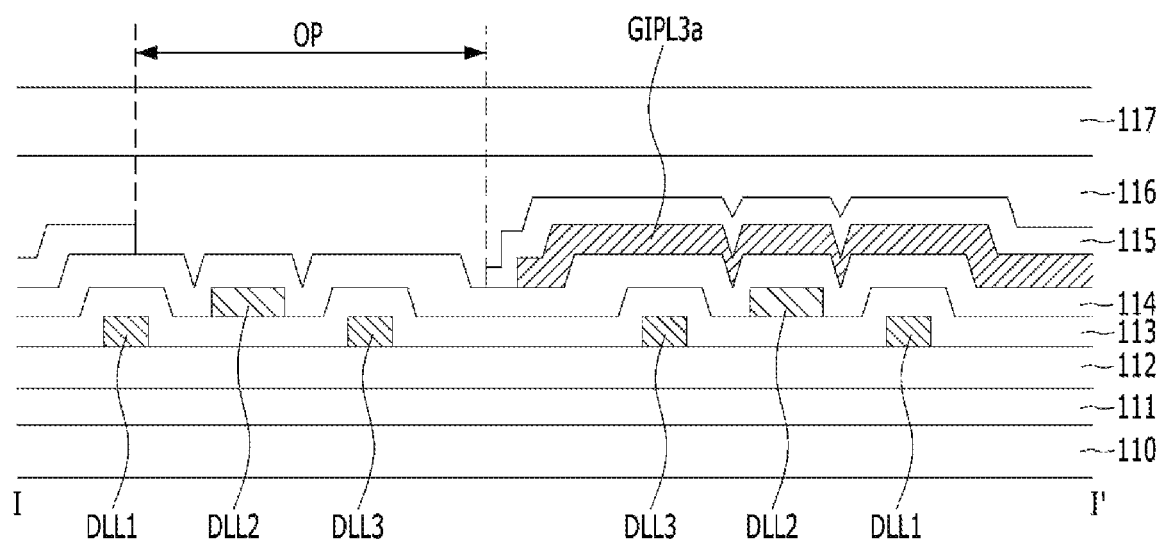
Figure 6:
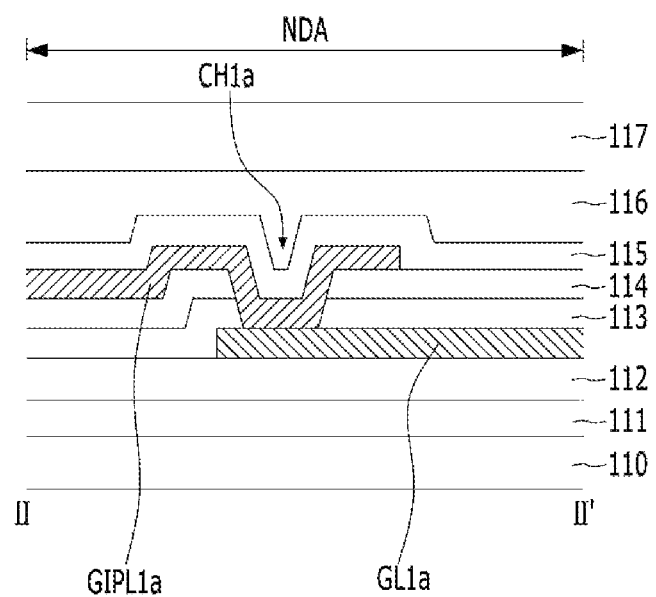
FIG. 6 is a cross-sectional view taken along line II-II' of FIG. 3.
Figure 7A:
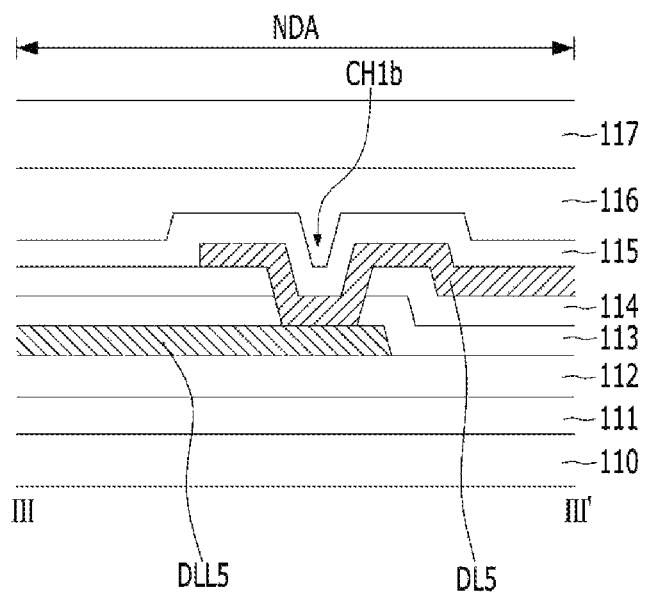
FIG. 7A is a cross-sectional view taken along line III-III' of FIG. 3.
Figure 7B:
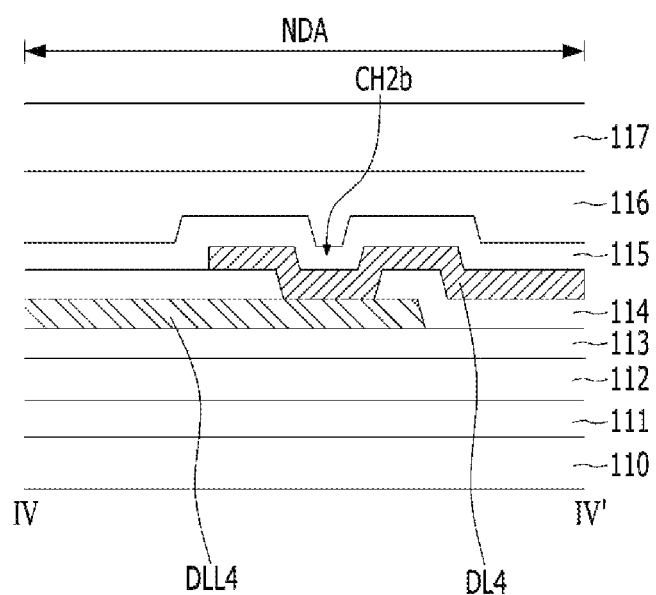
FIG. 7B is a cross-sectional view taken along line IV-IV' of FIG. 3.

FIG. 3 is an enlarged plan view of an area A shown in FIG. 1, FIG. 4 is a cross-sectional view taken along line I-I' of FIG. 3, FIGS. 5A to 5F are cross-sectional views taken along line I-I' of FIG. 3, which shows a manufacturing process, FIG. 6 is a cross-sectional view taken along line II-II' of FIG. 3, FIG. 7A is a cross-sectional view taken along line III-III' of FIG. 3, and FIG. 7B is a cross-sectional view taken along line IV-IV' of FIG. 3.

FIG. 3 shows the second power supply line VSL, the first gate driver GIPa of the gate drivers GIP, a (1-1)-th gate voltage supply line GIPL1a, a (1-2)-th gate voltage supply line GIPL2a, and a (1-3)-th gate voltage supply line GIPL3a of the first gate voltage supply lines GIPLa, and a first data link line DLL1, a second data link line DLL2, a third data link line (DLL3), a fourth data link line DLL4, and a fifth data link line DLL5 of the data link lines DL disposed in the non-display area (NDA). In addition, a (1-1)-th gate line GL1a, a (1-2)-th gate line GL2a, and a (1-3)-th gate line GL3a of the first gate lines GLa, and a fourth data line DL4 and a fifth data line DL5 of the data lines DL disposed in the display area DA are shown. In addition, first contact parts CHa connecting the first gate lines GLa with the first gate voltage supply lines GIPLa and second contact parts CHb connecting the data link lines DLL with the data lines DL in the non-display area NDA are shown.

The second power supply line VSL may be disposed adjacent to the display area DA. The first gate driver GIPa of the gate drivers GIP may be disposed between the second power supply line VSL and the display area DA. The data link lines DLL may be disposed between the first gate driver GIPa and the display area DA. The data link lines DLL may be connected to the data lines DL disposed in the display area DA through the second contact parts CHb, which are disposed between the data link lines DLL and the display area DA. One side of the data lines DL disposed in the display area DA may extend to the second contact parts CHb located in the non-display area NDA to be connected to the data link lines DLL. The first gate voltage supply lines GIPLa connected to the first gate driver GIPa may be connected to the first gate lines GLa disposed in the display area DA through the first contact part CHa. One side of each of the first gate lines GLa disposed in the display area DA may extend to each of the first contact parts CHa located in the non-display area NDA to be connected to each of the first gate voltage supply lines GIPLa.

For example, the (1-1)-th gate voltage supply line GIPL1a of the first gate voltage supply lines GIPLa may be connected to the (1-1)-th gate line GL1a of the first gate lines GLa at the (1-1)-th contact part CH1a of the first contact parts CHa. The (1-2)-th gate voltage supply line GIPL2a of the first gate voltage supply lines GIPLa may be connected to the (1-2)-th gate line GL2a of the first gate lines GLa at the (1-2)-th contact part CH2a of the first contact parts CHa. The (1-3)-th gate voltage supply line GIPL3a of the first gate voltage supply lines GIPLa may be connected to the (1-3)-th gate line GL3a of the first gate lines GLa at the (1-3)-th contact part CH3a of the first contact parts CHa.

The fourth data link line DLL4 of the data link lines DLL may be connected to the fourth data line DL4 of the data lines DL through the (2-2)-th contact part CH2b of the second contact parts CHb. The fifth data link line DLL5 of the data link lines DLL may be connected to the fifth data line DL5 of the data lines DL through the (2-1)-th contact part CH1b of the second contact parts CHb.

The first gate voltage supply lines GIPLa may be disposed on the data link lines DLL and intersect with the data link lines DLL. For example, as shown in FIGS. 3 and 4, the (1-3)-th gate voltage supply line GIPL3a of the first gate voltage supply lines GIPLa may be disposed on the first data link line DLL1, the second data link line DLL2, and the third data link line DLL3 of the data link lines DLL, and intersect with the first data link line DLL1, the second data link line DLL2, and the third data link line DLL3.

Although only three lines of the first gate voltage supply lines GIPLa are shown connected to the first gate lines GLa in FIG. 3, the present disclosure is not limited thereto. For example, the first gate voltage supply lines GIPLa and the second gate voltage supply lines GIPLb may be connected to the first gate lines GLa and the second gate lines GLb through the contact parts having the same structure as the first contact parts CHa, respectively. The gate voltage supply lines GIPL may be connected to the gate lines GL through the first contact parts CHa. In addition, although only two lines of the data link lines DLL are shown connected to the data lines DL through the contact parts, the present disclosure is not limited thereto. For example, a plurality of data link lines DLL may be connected to a plurality of data lines DL through the contact parts having the same structure as the (2-1)-th contact part CH1b or the (2-2)-th contact part CH2b.

The area A of FIG. 1 is an area in which the substrate 110 and the display area DA have a deformed shape, such as a round or otherwise curved shape, in the display apparatus 100. As shown in FIG. 3, in the area having the deformed part, the first gate voltage supply lines GIPLa may be disposed to overlap the data link lines DLL. For example, in the non-display area NDA corresponding to the deformed part of the display apparatus 100, the first gate voltage supply lines GIPLa connected to the first gate driver GIPa may be disposed on the second interlayer insulating layer 114. In addition, the data link lines DLL may be disposed on the gate insulating layer 112. Also, the first gate voltage supply lines GIPLa may overlap the data link lines DLL with the second interlayer insulating layer 114 interposed therebetween.

FIG. 4 is a cross-sectional view taken along line I-I' of FIG. 3. FIG. 4 is an enlarged view of only a portion of the display apparatus 100, and thus, the number of components shown in FIG. 4 is not limited. The configuration and positional relationship of some components shown in FIG. 4 are equally applicable to those of the components disposed in the other areas.

With reference to FIG. 4, the buffer layer 111 may be disposed on the substrate 110 in the non-display area NDA. The gate insulating layer 112 may be disposed thereon. The first data link line DLL1 and the third data link line DLL3 may be disposed on the gate insulating layer 112. The first data link line DLL1 and the third data link line DLL3 may be disposed on the same layer as the gate electrode 124 of the thin film transistor 120, and may be formed of the same material as the gate electrode. In addition, the first interlayer insulating layer 113 covering the first data link line DLL1 and the third data link line DLL3 disposed on the gate insulating layer 112 may be disposed. The second data link line DLL2 may be disposed on the first interlayer insulating layer 113. The second data link line DLL2 may be disposed on the same layer as the second capacitor electrode 132 of the storage capacitor 130, and may be formed of the same material as the second capacitor electrode. The second data link line DLL2 may be disposed between the first data link line DLL1 and the third data link line DLL3.

In the display apparatus 100 according to an embodiment of the present disclosure, the space of the non-display area NDA may be narrow, in order to implement a narrow bezel. In order to arrange the plurality of data link lines DLL in the limited space, odd-numbered data link lines and even-numbered data link lines among the plurality of data link lines may be disposed on different insulating layers. For example, the odd-numbered data link lines DLL such as the first data link line DLL1, the third data link line DLL3 and the fifth data link line DLL5 may be disposed between the gate insulating layer 112 and the first interlayer insulating layer 113. In addition, the even-numbered data link lines DLL such as the second data link line DLL2 and the fourth data link line DLL4 may be disposed between the first interlayer insulating layer 113 and the second interlayer insulating layer 114. The odd-numbered data link lines DLL1, DLL3, DLL5, . . . and the even-numbered data link lines DLL2, DLL4, DLL6, . . . may be disposed on different insulating layers, thereby reducing a spacing between the plurality of data link lines DLL. The odd-numbered data link lines DLL may be connected to the odd-numbered data lines DL through the (2-1)-th contact part CH1b of the second contact parts CHb. The even-numbered data link lines DLL may be connected to the even-numbered data lines DL through the (2-2)-th contact parts CH2b of the second contact parts CHb.

The second interlayer insulating layer 114 covering the second data link line DDL2 may be disposed on the first interlayer insulating layer 113.

In addition, the (1-3)-th gate voltage supply line GIPL3a of the first gate voltage supply lines GIPLa may be disposed on the second interlayer insulating layer 114. Furthermore, the (1-3)-th gate voltage supply line GIPL3a may be disposed to overlap the first data link line DLL1, the second data link line DLL2 and the third data link line DLL3. The (1-3)-th gate voltage supply line GIPL3*a* may be disposed on the same layer as the source electrode 122 and the drain electrode 123 of the thin film transistor 120 and, in this case, may be formed of the same material as the source electrode and the drain electrode.

With reference to FIG. 5A, in order to form the (1-3)-th gate voltage supply line GIPL3*a*, a first metal layer 201 may be formed on the second interlayer insulating layer 114. The first metal layer 201 may be formed of the same material as the source electrode 122 and the drain electrode 123 of the thin film transistor 120.

The first metal layer 201 may be subjected to a patterning process as shown in FIG. 5B, thereby forming the (1-3)-th gate voltage supply line GIPL3*a*. With reference to FIG. 5B, some of the first metal layer 201 to be removed in the patterning process may remain as a residue 202. The second interlayer insulating layer 114 may include grooves. The grooves of the second interlayer insulating layer 114 may be located in the second interlayer insulating layer 114 being disposed in correspondence with a portion where data link lines DLL are spaced apart from each other. In the patterning process of forming the gate voltage supply lines GIPL, a portion of the first metal layer 201 may not be removed, and may be left as the residue 202. For example, the groove may be located in the upper surface of the second interlayer insulating layer 114 overlapping with a portion between the first data link line DLL1 and the second data link line DLL2 where they are spaced apart from each other. In the patterning process of forming the (1-3)-th gate voltage supply line GIPL3*a*, some of the first metal layer to be removed may not be removed, and the residue 202 may remain in the groove of the second interlayer insulating layer 114.

The protective layer 115 covering the (1-3)-th gate voltage supply line GIPL3*a* may be disposed on the second interlayer insulating layer 114. The protective layer 115 corresponding to an area which overlaps residue 202 may be removed to form an opening part OP for exposing the second interlayer insulating layer 114 and the residue 202.

As shown in FIG. 3, the plurality of first gate voltage supply lines GIPLa may be disposed to be spaced apart from each other. And a portion of the protective layer 115, corresponding to the area where the plurality of first gate voltage supply lines GIPLa are spaced part from each other and overlapping with the data link lines DLL, may be removed (e.g., by etching) to form the opening part OP to expose the second interlayer insulating layer 114.

With reference to FIG. 5C, the residue 202 of the first metal layer 201 located in the grooves of the second interlayer insulating layer 114 may be exposed through the opening part OP of the protective layer 115. Alternatively, the residue 202 may be removed when the portion of the protective layer 115 is removed to form the opening part OP. In this case, the steps described with reference to FIGS. 5D and 5E for removal of the residue 202 may not be performed.

As shown in FIGS. 5D and 5E, after the second metal layer 211 is formed, the second metal layer 211 may be removed and, at the same time, the residue 202 may also be removed. The second metal layer 211 may be formed of the same material as the auxiliary electrode 161. The second metal layer 211 and the residue 202 may be removed by an etching process.

As shown in FIGS. 4 and 5F, the first planarization layer 116 and the second planarization layer 117 may be disposed on the second interlayer insulating layer 114, from which the residue 202 and protective layer 115 are removed. The first planarization layer 116 and the second planarization layer 117 covering the upper surface of the second interlayer insulating layer 114 exposed through the opening part OP of the protective layer 115 and the upper surface of the protective layer 115 may be disposed. The sealing part 150 may be disposed on the second planarization layer 117.

FIG. 6 is a cross-sectional view taken along line II-II' of FIG. 3. The first gate lines GLa disposed in the display area DA may extend to the non-display area NDA. In addition, the first gate lines GLa may be connected to the first gate voltage supply lines GIPLa at the first contact parts CHa of the non-display area NDA. For example, in the display area DA, the first gate line GL1*a* may be disposed on the gate insulating layer 112. The first gate line GL1*a* may be formed of the same material as the gate electrode 124 of the thin film transistor 120, and may be disposed on the same layer as the gate electrode 124. One end of the first gate line GL1*a* may extend to the non-display area NDA. The first contact parts CHa for exposing the first gate lines GLa may be disposed in the non-display area NDA. The first gate lines GLa may be connected to the first gate voltage supply lines GIPLa through the first contact parts CHa for exposing the first gate lines GLa. The first gate voltage supply lines GIPLa may be formed of the same material as the source electrode 122 and the drain electrode 123 of the thin film transistor 120, and may be disposed on the same layer as the source electrode 122 and the drain electrode 123.

With reference to FIG. 6, one end of the (1-1)-th gate line GL1*a* of the first gate lines GLa may extend to the non-display area NDA and may be disposed on the gate insulating layer 112. In addition, the first interlayer insulating layer 113 and the second interlayer insulating layer 114 covering the (1-1)-th gate line GL1*a* may be disposed on the gate insulating layer 112. The first interlayer insulating layer 113 and the second interlayer insulating layer 114 may include the (1-1)-th contact part CH1*a* for exposing the (1-1)-th gate line GL1*a*. In addition, the (1-1)-th gate voltage supply line GIPL1*a* of the first gate voltage supply lines GIPLa may be disposed on the second interlayer insulating layer 114. The (1-1)-th gate voltage supply line GIPL1*a* may be connected to the (1-1)-th gate line GL1*a* through the (1-1)-th contact part CH1*a*.

FIG. 7A is a cross-sectional view taken along line of FIG. 3, and FIG. 7B is a cross-sectional view taken along line IV-IV' of FIG. 3. The data lines DL disposed in the display area DA may extend to the non-display area NDA and may be connected to the data link lines DLL at the second contact parts CHb of the non-display area NDA. For example, in the display area DA, the data lines DL may be disposed on the first interlayer insulating layer 114. The data lines DL may be formed of the same material as the source electrode 122 and the drain electrode 123 of the thin film transistor 120, and may be disposed on the same layer as the source electrode 122 and the drain electrode 123. One end of each of the data lines DL may extend to the non-display area NDA. In addition, in the non-display area NDA, the second contact parts CHb for exposing the data link lines DLL may be disposed. Also, the data lines DL may be connected to the data link lines DLL through the second contact parts CHb for exposing the data link lines DLL. The data link lines DLL may be formed of the same material as the second capacitor electrode 132 of the storage capacitor 130 or the gate electrode 124 of the thin film transistor 120. In addition, the data link lines DLL may be disposed on the same layer as the second capacitor electrode 132 of the storage capacitor 130 or the gate electrode 124 of the thin film transistor 120.

With reference to FIG. 7A, the connection relationship between the data link lines DLL and the data lines DL when the data link lines DLL are formed on the same layer as the gate electrode 124 of the thin film transistor 120 is shown. FIG. 7B shows the connection relationship between the data link lines DLL and the data lines DL when the data link lines DLL are disposed on the same layer as the second capacitor electrode 132 of the storage capacitor 130. With reference to FIG. 7A, in the non-display area NDA, the fifth data link line DLL5 of the data link lines DLL may be disposed on the gate insulating layer 112. The first interlayer insulating layer 113 and the second interlayer insulating layer 114 covering the fifth data link line DLL5 may be disposed on the gate insulating layer 112. In addition, the first interlayer insulating layer 113 and the second interlayer insulating layer 114 may include a (2-1)-th contact part CH1b for exposing the fifth data link line DLL5. In addition, the fifth data line DL5 of the data lines DL may be disposed on the second interlayer insulating layer 114. The fifth data line DL5 may be connected to the fifth data link line DLL5 through the (2-1)-th contact part CH1b. The first data link line DLL1 and the third data link line DLL3 may be formed of the same material as the fifth data link line DLL5, and may be formed on the same layer as the fifth data link line. The first data link line DLL1 and the third data link line DLL3 may be connected to the first data line DL1 and the third data line DL3 through the contact part having the same contact structure as the (2-1)-th contact part CH1b, respectively.

With reference to FIG. 7B, in the non-display area NDA, the fourth data link line DLL4 of the data link lines DLL may be disposed on the gate insulating layer 112. The first interlayer insulating layer 113 and the second interlayer insulating layer 114 covering the fourth data link line DLL4 may be disposed on the gate insulating layer 112. The first interlayer insulating layer 113 and the second interlayer insulating layer 114 may include a (2-2)-th contact part for exposing the fourth data link line DLL4. In addition, the fourth data line DL4 of the data lines DL may be disposed on the second interlayer insulating layer 114. The fourth data line DL4 may be connected to the fourth data link line DLL4 through the (2-2)-th contact part CH2b.

The second data link line DLL2 may be formed of the same material as the fourth data link line DLL4, and may be formed on the same layer as the fourth data link line. In addition, the second data link line DLL2 may be connected to the second data line through the contact part having the same contact structure as the (2-2)-th contact part CH2b.

The display apparatus according to an embodiment of the present disclosure may include the deformed part such as a round or otherwise curved shape. In addition, the gate voltage supply lines GIPL connecting the gate drivers GIP with the gate lines GL of the display area DA may be disposed on the data link lines DLL connecting the data pad of the pad area PA with the data lines DL of the display area DA in the round-shaped area of the display apparatus. Furthermore, the gate voltage supply lines GIPL may intersect with the data link lines DLL.

In a process of forming the gate voltage supply lines GIPL on the data link lines DLL, the metal layer may remain as residual films in the grooves of the second interlayer insulating layer 114 disposed between the data link lines DLL, which may thereby deteriorate performance of the display device and shorten lifespan. Accordingly, by removing the residual films in an etching process of forming the gate voltage supply lines GIPL after forming the protective layer 115 including the opening part OP for exposing the residual films, it may be possible to prevent failure due to the residual films.

The display apparatus according to an embodiment of the present disclosure will be described as follows.

A display apparatus according to an embodiment of the present disclosure may include a substrate including a display area, in which gate lines and data lines are disposed, and a non-display area, in which a gate driver and a pad part are disposed; a gate insulating layer on the substrate; data link lines on the gate insulating layer to connect data pads of the pad part to the data lines; an interlayer insulating layer on the data link lines; gate voltage supply lines on the interlayer insulating layer to connect the gate driver with the gate lines; and a protective layer on the interlayer insulating layer to cover the gate voltage supply lines, the protective layer including an opening for exposing the interlayer insulating layer of an area overlapping the data link lines.

According to the embodiment of the present disclosure, the interlayer insulating layer may include a first interlayer insulating layer between the first data link line and the second data link line and a second interlayer insulating layer between the second data link line and the gate voltage supply lines.

According to the embodiment of the present disclosure, an upper surface of the second interlayer insulating layer may be exposed through the opening of the protective layer.

According to the embodiment of the present disclosure, the upper surface of the second interlayer insulating layer exposed through the opening may include a groove overlapping an area in which the first data link line and the second data link line are spaced apart from each other.

According to the embodiment of the present disclosure, the data link lines and the gate voltage supply lines may intersect with each other in plan view.

According to the embodiment of the present disclosure, a thin film transistor and a storage capacitor may be disposed in the display area of the substrate.

According to the embodiment of the present disclosure, the thin film transistor may include an active layer on the substrate, a gate electrode overlapping the active layer with the gate insulating layer interposed therebetween, and a source electrode and a drain electrode connected to the active layer through contact holes in the first interlayer insulating layer and the second interlayer insulating layer.

According to the embodiment of the present disclosure, the storage capacitor may include a first capacitor electrode on the gate insulating layer and a second capacitor electrode overlapping the first capacitor electrode with the first interlayer insulating layer interposed therebetween.

According to the embodiment of the present disclosure, the first data link line may be formed of a same material as the gate electrode and is on a same layer as the gate electrode.

According to the embodiment of the present disclosure, the second data link line may be formed of a same material as the second capacitor electrode and may be on a same layer as the second capacitor electrode.

According to the embodiment of the present disclosure, the gate voltage supply lines may be formed of a same material as the source electrode and the drain electrode and may be on a same layer as the source electrode and the drain electrode.

According to the embodiment of the present disclosure, the gate voltage supply lines may be on the second interlayer insulating layer and intersect with the first data link line and the second data link line in plan view.

According to the embodiment of the present disclosure, one end of each of the gate lines may extend to the non-display area and may be connected to one of the gate voltage supply lines through a first contact part.

According to the embodiment of the present disclosure, a planarization layer may cover the upper surface of the second interlayer insulating layer exposed through the opening.

According to the embodiment of the present disclosure, the data lines may include a first data line and a second data line, one end of each of the first data line and the second data line may extend to the non-display area, and the first data line may be connected to the first data link line through a (2-1)-th contact part and the second data line may be connected to the second data link line through a (2-2)-th contact part.

A display apparatus according to an embodiment of the present disclosure may include a substrate on which are gate lines, data lines, a gate driver, and a pad part; a gate insulating layer on the substrate; data link lines on the gate insulating layer and connecting the pad part with the data lines; an interlayer insulating layer on the data link lines; gate voltage supply lines on the interlayer insulating layer and connecting the gate driver with the gate lines; and a protective layer on the interlayer insulating layer and covering the gate voltage supply lines, wherein the protective layer including an opening that exposes the interlayer insulating layer at an area overlapping the data link lines.

According to the embodiment of the present disclosure, the opening may be between the gate voltage supply lines in a curved portion of the display apparatus.

According to the embodiment of the present disclosure, the opening may not overlap the gate voltage supply lines.

According to the embodiment of the present disclosure, the data link lines may be spaced apart at the opening.

It will be apparent to those skilled in the art that various modifications and variations can be made in the display apparatus of the present disclosure without departing from the spirit or scope of the disclosure. Thus, it is intended that the present disclosure covers the modifications and variations of this disclosure provided they come within the scope of the appended claims and their equivalents.

What is claimed is:

1. A display apparatus, comprising:
    a substrate including a display area, in which gate lines and data lines are disposed, and a non-display area, in which a gate driver and a pad part are disposed;
    a gate insulating layer on the substrate;
    data link lines on the gate insulating layer to connect data pads of the pad part to the data lines;
    an interlayer insulating layer on the data link lines;
    gate voltage supply lines on the interlayer insulating layer to connect the gate driver with the gate lines; and
    a protective layer on the interlayer insulating layer to cover the gate voltage supply lines, the protective layer including an opening for exposing the interlayer insulating layer of an area overlapping the data link lines.

2. The display apparatus of claim 1, wherein:
    the data link lines include a first data link line and a second data link line; and
    the interlayer insulating layer includes a first interlayer insulating layer between the first data link line and the second data link line and a second interlayer insulating layer between the second data link line and the gate voltage supply lines.

3. The display apparatus of claim 2, wherein an upper surface of the second interlayer insulating layer is exposed through the opening of the protective layer.

4. The display apparatus of claim 3, wherein the upper surface of the second interlayer insulating layer exposed through the opening includes a groove overlapping an area in which the first data link line and the second data link line are spaced apart from each other.

5. The display apparatus of claim 3, wherein a planarization layer covers the upper surface of the second interlayer insulating layer exposed through the opening.

6. The display apparatus of claim 2, wherein a thin film transistor and a storage capacitor are disposed in the display area of the substrate.

7. The display apparatus of claim 6, wherein the thin film transistor includes:
    an active layer on the substrate,
    a gate electrode overlapping the active layer with the gate insulating layer interposed therebetween, and
    a source electrode and a drain electrode connected to the active layer through contact holes in the first interlayer insulating layer and the second interlayer insulating layer.

8. The display apparatus of claim 7, wherein the storage capacitor includes a first capacitor electrode on the gate insulating layer and a second capacitor electrode overlapping the first capacitor electrode with the first interlayer insulating layer interposed therebetween.

9. The display apparatus of claim 8, wherein the second data link line is formed of a same material as the second capacitor electrode and is on a same layer as the second capacitor electrode.

10. The display apparatus of claim 7, wherein the first data link line is formed of a same material as the gate electrode and is on a same layer as the gate electrode.

11. The display apparatus of claim 6, wherein the gate voltage supply lines are formed of a same material as the source electrode and the drain electrode and are on a same layer as the source electrode and the drain electrode.

12. The display apparatus of claim 2, wherein the gate voltage supply lines are on the second interlayer insulating layer and intersect with the first data link line and the second data link line in plan view.

13. The display apparatus of claim 2, wherein one end of each of the gate lines extends to the non-display area and is connected to one of the gate voltage supply lines through a first contact part.

14. The display apparatus of claim 13,
    wherein the data lines include a first data line and a second data line,
    wherein one end of each of the first data line and the second data line extends to the non-display area, and
    wherein the first data line is connected to the first data link line through a (2-1)-th contact part and the second data line is connected to the second data link line through a (2-2)-th contact part.

15. The display apparatus of claim 1, wherein the data link lines and the gate voltage supply lines intersect with each other in plan view.

16. A display apparatus, comprising:
    a substrate on which are gate lines, data lines, a gate driver, and a pad part;
    a gate insulating layer on the substrate;
    data link lines on the gate insulating layer and connecting the pad part with the data lines;
    an interlayer insulating layer on the data link lines;

gate voltage supply lines on the interlayer insulating layer and connecting the gate driver with the gate lines; and a protective layer on the interlayer insulating layer and covering the gate voltage supply lines, wherein the protective layer including an opening that exposes the interlayer insulating layer at an area overlapping the data link lines.

17. The display apparatus of claim 16, wherein the opening is between the gate voltage supply lines in a curved portion of the display apparatus.

18. The display apparatus of claim 17, wherein the opening does not overlap the gate voltage supply lines.

19. The display apparatus of claim 16, wherein the data link lines are spaced apart at the opening.

\* \* \* \* \*